(12) United States Patent
Ho

(10) Patent No.: US 6,753,600 B1
(45) Date of Patent: Jun. 22, 2004

(54) STRUCTURE OF A SUBSTRATE FOR A HIGH DENSITY SEMICONDUCTOR PACKAGE

(75) Inventor: Chung W. Ho, Taipei (TW)

(73) Assignee: Thin Film Module, Inc., Hsinchu (TW)

( * ) Notice: Subject to any disclaimer, the term of this patent is extended or adjusted under 35 U.S.C. 154(b) by 0 days.

(21) Appl. No.: 10/604,838

(22) Filed: Aug. 21, 2003

Related U.S. Application Data
(60) Provisional application No. 60/319,909, filed on Jan. 28, 2003.

(51) Int. Cl.[7] .................. H01L 23/04; H01L 23/22; H01L 23/24; H01L 23/10; H01L 23/34
(52) U.S. Cl. .................. 257/698; 257/687; 257/699; 257/707; 257/709; 257/738
(58) Field of Search .................. 257/687, 698, 257/699, 700, 706, 707, 708, 709, 712, 737, 738, 786

(56) References Cited

U.S. PATENT DOCUMENTS 6,657,296 B2 * 12/2003 Ho et al. .................. 257/720

2003/0057545 A1 * 3/2003 Shim et al. .................. 257/706
2004/0004281 A1 * 1/2004 Bai et al. .................. 257/706

* cited by examiner

Primary Examiner—Ngân V. Ngô
(74) Attorney, Agent, or Firm—Jiang Chyun IP Office

(57) ABSTRACT

A structure of a substrate for a high-density semiconductor package is provided. The structure of the substrate comprises a metal substrate and an interconnect substrate disposed on the second surface of the metal substrate. The interconnect substrate comprises at least one or more metal and inter-metal dielectric layers comprising a plurality of traces/lines, pads and vias appropriate for the design. One or more dice are attached to the top surface of the metal substrate, wire bonds are used to connect the dice through open slots on the metal substrate to the Ni/Au plated pads on the interconnect substrate. The uppermost wiring layers are electrically connected to the ball pads on the bottom surface through a plurality of wiring layers and conductive vias. The ball pads are attached to the lowest wiring layer. At least one thermally conductive via is attached to the metal substrate underneath the metal die pad and in direct physical contact so that the heat generated by the IC chip can be efficiently conducted and transferred to the PCB.

21 Claims, 2 Drawing Sheets

US 6,753,600 B1

STRUCTURE OF A SUBSTRATE FOR A HIGH DENSITY SEMICONDUCTOR PACKAGE

CROSS REFERENCE TO RELATED APPLICATIONS

This application is a non-provisional application of, and claims the priority benefit of, U.S. provisional application serial No. 60/319,909, filed Jan. 28, 2003.

BACKGROUND OF INVENTION

1. The Field of the Invention

The present invention is generally related to a semiconductor package, and more particularly related to a structure of a substrate for a high-density semiconductor package. The present invention can be applied for making a ball grid array (BGA) package, land grid array (LGA) package or a pin grid array (PGA) package.

2. Description of the Related Art

Grid array packaging has become a technique of first choice for connecting semiconductor chips with a printed circuit board (PCB). This technology, namely, a BGA, a LGA or a PGA, is designed to make connection with a PCB. A conventional BGA, such as Amkor's Super BGA, comprises a laminate substrate, a metal die pad attached on the laminate substrate and a semiconductor chip attached to the metal member, wherein metal member functions as a heat sink for dissipating the heat generated by the semiconductor chip. Other prior arts such as ProLinx's Viper BGA and Substrate Technology Inc.'s Ultra BGA, comprise a build up multi-layer interconnect structure, which is directly formed on a metal panel to make the BGA substrates. These designs are generally called cavity down BGA substrates because the die is attached in a cavity on the bottom side of the metal substrate surface. However, the conventional BGA structures described above have the following problems. First, the die is usually located at a central region of the substrate and the interconnection wirings & the BGA solder balls are disposed along the perimeter of the substrate surrounding of the die and the wire bond pad areas. The BGA solder balls and wire bond pads occupy a significant lateral space on the substrate thus the substrate size becomes large in size having to accommodate the die area, the wire bond pad area and the BGA pads all on the same side. Further, larger space occupation also leads to extra consumption of material and correspondingly larger work-stations increasing the overall manufacturing cost. Furthermore, a larger substrate occupies a larger area on the printed circuit board and an increase of the corresponding product cost for the PCB which carries the substrate. Secondly, the thin film fabrication approach is used which has a high interconnect density. It results in a less number of wiring layers and a correspondingly a less amount of material usage and a shorter process cycle. This reduces the total product cost. Thirdly, since one of the primary purpose of the cavity down design is for heat dissipation, and the primary heat conduction path being through the BGA solder balls, but the BGA solder balls are disposed laterally adjacent to the die area and furthermore being isolated from the semiconductor chip by a plurality of dielectric layers, and therefore the heat conduction and heat dissipation are relatively poor. Thus the heat dissipation allowed in the semiconductor device becomes more limited.

Accordingly, it is highly desirable to improve the structure of the semiconductor package in order to resolve the above-mentioned disadvantages of the conventional semiconductor package.

SUMMARY OF INVENTION

According, in the light of the foregoing, it is an object of the present invention to provide a structure of a substrate for a high-density semiconductor package with the aim of resolving the problems of the prior art.

One object of the present invention is to provide a structure of a substrate for a high-density semiconductor package.

Another object of the present invention is to substantially improve the heat dissipation efficiency of the semiconductor package.

Yet another object of the present invention is to substantially reduce the size of the semiconductor chip package so that the fabrication cost of a high density package device can be reduced.

Yet another object of the present invention is to substantially reduce the space occupied by the semiconductor package on the PCB.

In accordance with the above objects and other advantages of the present invention, a structure of a substrate for a high-density semiconductor package is provided. The structure of the substrate essentially comprises a metal panel having a first surface and a second surface and an interconnect substrate attached to the second surface of the metal panel. The interconnect substrate comprises an alternately stacked interconnect wiring layers and inter-metal dielectric layers. A plurality of conductive vias is disposed within the inter-metal dielectric layers to electrically connect the wire bonding pads which are part of the first wiring layer and is next to the second surface of the metal panel. The wire bonding pads are designed for electrically connecting with of the IC chip through bondwires.

Furthermore, the first wiring layer is electrically connected to the ball pads on the bottom surface of the interconnect substrate through a plurality of wiring layers and conductive vias. The ball pads are part of the lowest wiring layer, which is furthest away from the second surface of the metal panel. The plurality of wiring layers may constitute fan out layers, power/ground layers. A conductive structure such as a solder ball may also be attached to each ball pad so that the package is electrically connected to the next level of electronic device, for example, a printed circuit board (PCB). Hence, the IC chip is capable of transmitting signals to external electronic devices through the package substrate.

The first surface of the metal panel comprises at least a die attachment area at a prescribed location for attaching an IC chip. A plurality of openings or slots are formed within the perimeter of the die attachment area at prescribed locations exposing a portion of the inter-metal dielectric layer of the interconnect substrate within the openings or slots, for example, over the buried wire bonding pads. Next, lasers may be used to selectively remove the exposed inter-metal dielectric layer until the wire bonding pads are exposed. Next, the wire bonding pads are plated with Ni/Au with an appropriate thickness. For attaching the IC chip onto the die attachment area, a layer of adhesive may be coated onto the die attachment area for the die attachment process. The IC chip pads and the Ni/Au plated wire bonding pads are bonded together using wire bonding, and thus the IC chip is electrically connected with the interconnect substrate.

Further, according to a preferred embodiment of the present invention, at least one thermally conductive via is in direct physical contact with the second surface of the metal substrate, which is positioned underneath the die attachment area. Since the thermally conductive via is directly in physical contact with the metal substrate underneath the die attachment area on which the IC chip is attached, the heat generated by the IC chip can be efficiently conducted and transferred through the thermally conductive via to the PCB. It is to be understood that the heat conduction efficiency compared to the prior art in which multiple dielectric layers are disposed between the heat sink member and the IC chip to the printed circuit board which limit the heat transfer to the printed circuit board. In this invention heat transfer is promoted by introducing the thermally conductive vias in the inter connect substrate directly in physical contact with the metal substrate underneath the die attachment area on which the IC chip is attached to the printed circuit board.

According to another aspect of the present invention, the whole second surface of the interconnect substrate is available for forming fan out layers, power/ground layers and the array of solder pads. Therefore not all of the ball grid array pads need to be routed out to the peripheral regions so that routing becomes simplified even when the semiconductor chip has a high density.

According to another aspect of the present invention, the size of the semiconductor chip package can be substantially reduced so the total length of the interconnects from the die to the edges of the package substrate can be shortened and thereby reducing the signal transmission delays. In other words, the operating speed of the device can be effectively enhanced.

According to another aspect of the present invention, the interconnect substrate is fabricated using thin-films which has a high interconnect density.

A comparatively less number of interconnect layers are needed and hence less materials are required. The cost can be substantially reduced from the material usage point of view. Further, the process is simplified and also the duration of process steps are shortened and therefore the throughput and overall fabrication cost can be effectively reduced.

BRIEF DESCRIPTION OF DRAWINGS

For a more complete understanding of the present invention, reference will now be made to the following detailed description of preferred embodiments taken in conjunction with the accompanying drawings.

DETAILED DESCRIPTION

Figure 1:
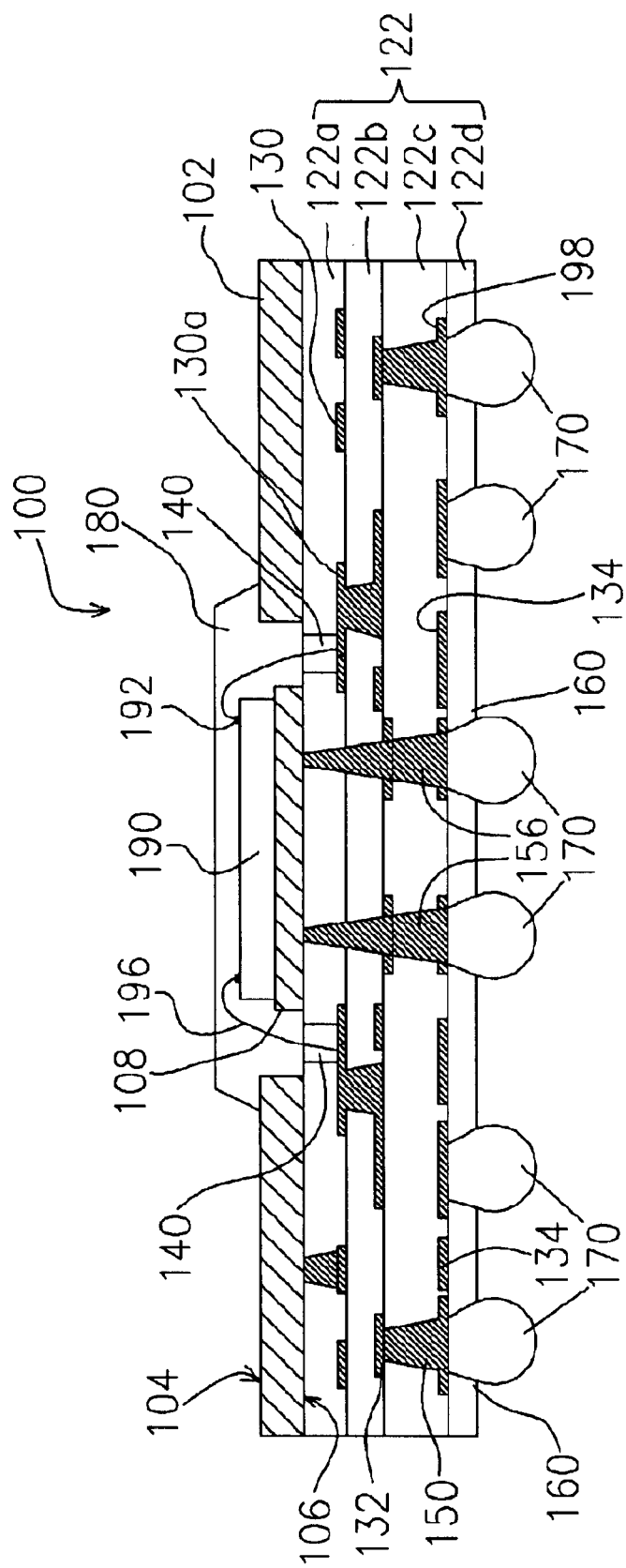
FIG. 1 is a cross-sectional of the BGA package of the present invention.

Reference will be made in detail to the preferred embodiments of the invention, examples of which are illustrated in the accompanying drawings.

Wherever possible, the same reference numbers are used in the drawings and the description to refer to the same or like parts.

Referring to FIG. 1, the sturcture of the package substrate 100 of the present invention essentially comprises a metal substrate 102 having a first surface 104 and a second surface 106 disposed opposite of the first surface 104, an interconnect substrate 122 having a top surface and a bottom surface, wherein the top surface is attached onto the second surface 106 of the metal substrate 102.

The inter-metal dielectric film 122a that forms the top surface of the interconnect substrate 122 is in contact with the metal substrate 102 and is referred as the top layer of the interconnect substrate, and the inter-metal film 122d that forms the bottom surface of the interconnect substrate 122 is referred to as the bottom layer. For example, the interconnect substrate 122 consists of alternately placed fan out lines 130 and wire bonding pads 130a on top of the inter-metal dielectric films 122b. A plurality of conductive vias 150 is disposed within the inter-metal dielectric films 122a, 122b, 122c and 122d, to electrically connect the wire bonding pads 130a. It is preferred that the top layer 122a of the interconnect substrate 122 comprises a plurality of wire bonding pads 130a for electrically connecting with pads 192 of the IC chip 190.

Furthermore, the second wiring layers 132 are electrically connected to the ball pads 198 on the bottom surface through a plurality of wiring layers 134 and conductive vias 150. The plurality of wiring layers may constitute fan out layers, power/ground layers. A conductive structure such as a solder ball 170 may also be attached to each ball pad 160 so that the package is electrically connected to the next level of electronic device, for example, a printed circuit board (PCB). Optionally, a solder mask 122d may be formed over the ball pads before forming solder balls are attached. Hence, the IC chip 190 is capable of transmitting signals to external electronic devices through the package substrate 100.

Preferably, the wiring layers 130, 132, 134, may be fabricated by using known conventional methods such as using the lamination and wet etch process or the pattern plating the conductive layers such as the thin film semi-additive plating process.

It is preferable that the metal substrate 102 is comprised of, but not limited to, copper, aluminum or stainless steel. It is further preferable that the size of the metal panel is, but not limited to, about 18×24 inches.

At least one opening or slot or a plurality of openings or slots are formed adjacent to the perimeter of the die attachment area 108 at prescribed locations, for example, over the buried wire bonding pads 130a, wherein portions of the inter-metal dielectric films 122a are exposed within the openings or slots. Next, lasers may be used to selectively remove the exposed inter-metal dielectric films 122a until the wire bonding pads 130a are exposed. Next, the wire bonding pads 130a are plated using Ni/Au to an appropriate thickness. Subsequently, a plurality of wires are used to electrically connect the IC chip 190 with the plated wire bonding pads 130a.

For attaching the IC chip 190 onto the die attachment area 108, a layer of thermally conductive adhesive 112 (not shown) may be coated onto the die attachment area 108, and then the IC chip 190 is placed into the die attachment area 108. Examples for thermally conductive adhesive layer are, but not limited to, thermally conductive epoxy such as thermoset or thermoplastic epoxy. The pads 192 of the IC chip 190 and the Ni/Au plated wire bonding pads 130a are bonded together using bonding wires 196, and thus the IC chip 190 is electrically connected with the interconnect substrate 122.

Further, according to a preferred embodiment of the present invention, at least one thermally conductive via 156 is attached to the second surface 106 of the metal substrate 102 underneath the die attachment area 108 for connecting with a PCB. Since the thermally conductive via 156 is directly in physical contact with the metal substrate underneath the die attachment area connecting with the PCB, the heat generated by the IC chip 190 can be efficiently conducted and transferred away from the IC chip 190 through the thermally conductive via 156 and the solder ball 170 to the PCB. It is to be understood that the heat conduction efficiency compared to the prior art in which multiple dielectric layers are disposed between the heat sink member and the IC chip 190 to the PCB which limit the heat transfer to the PCB. In this invention heat transfer is promoted by introducing the thermally conductive vias directly in contact with the bottom surface of the die attachment area 108 on which the IC chip 190 is attached. The invention therefore provides a key advantage of significantly improving the cooling of the IC devices that are mounted in the package of the present invention.

Further, the thermally conductive vias 156 and the electrically conductive vias 150 can be fabricated together using the same plating process and therefore the formation of thermally conductive vias 156 needs no special or additional process steps.

According to one aspect of the present invention, the Ni/Au plating step is performed after the last layer of conductive metal is deposited and before it is patterned so that it is used as the plating bus to electrically plate Ni/Au onto the wire bonding pads 130a. The plating of Ni/Au on top of the wire bonding pads 130a will take place only if the fan out interconnect lines and vias do not have opens as defects. Since it is very easy to inspect if some of the wire bonding pads have missing Au on them, one may thus use visual inspection in lieu of the electrical test to detect the open defects on the substrates to be tested. This is a cost saving step. For this approach to work, there should be no floating or unconnected interconnect lines within the interconnect substrate 122 to the BGA pads. This is always true for a single chip package. However, for multichip packages, there are floating interconnect lines between chips which do not come out to the last layer of the interconnect substrate 122. In such cases, one can simply bring out the floating lines to the last layer of the interconnect substrate 122 where a short stub is used to connect to a solder pad there. By doing so, all interconnect lines are shorted together by the last metal layer. The said short stub is etched open when the last interconnect layer is patterned after the inspection.

A thin layer of dielectric material (now shown) may be screened or laminated on the metal substrate 100 as part of a build up process. The layer of dielectric material may be comprised of glass fiber or any material capable of strengthening the areas where the slots are formed. A set of pedestals may be etched or plated on the surface of the metal substrate 100 at prescribed regions of the solder pads before the dielectric layer is deposited, so that the dielectric layer thickness in the prescribed regions is reduced for better heat conduction from the metal substrate to the BGA pads.

After the last metal layer is patterned and finished, a solder mask layer is deposited on the bottom layer, the metal substrate 102 is singulated into individual substrates to facilitate the die attachment and other assembly steps. The metal substrate 102 may be comprised of a single or a plurality of die attachment areas, wherein each die attachment area is designed to facilitate die attachment and other assembly steps.

Figure 2:
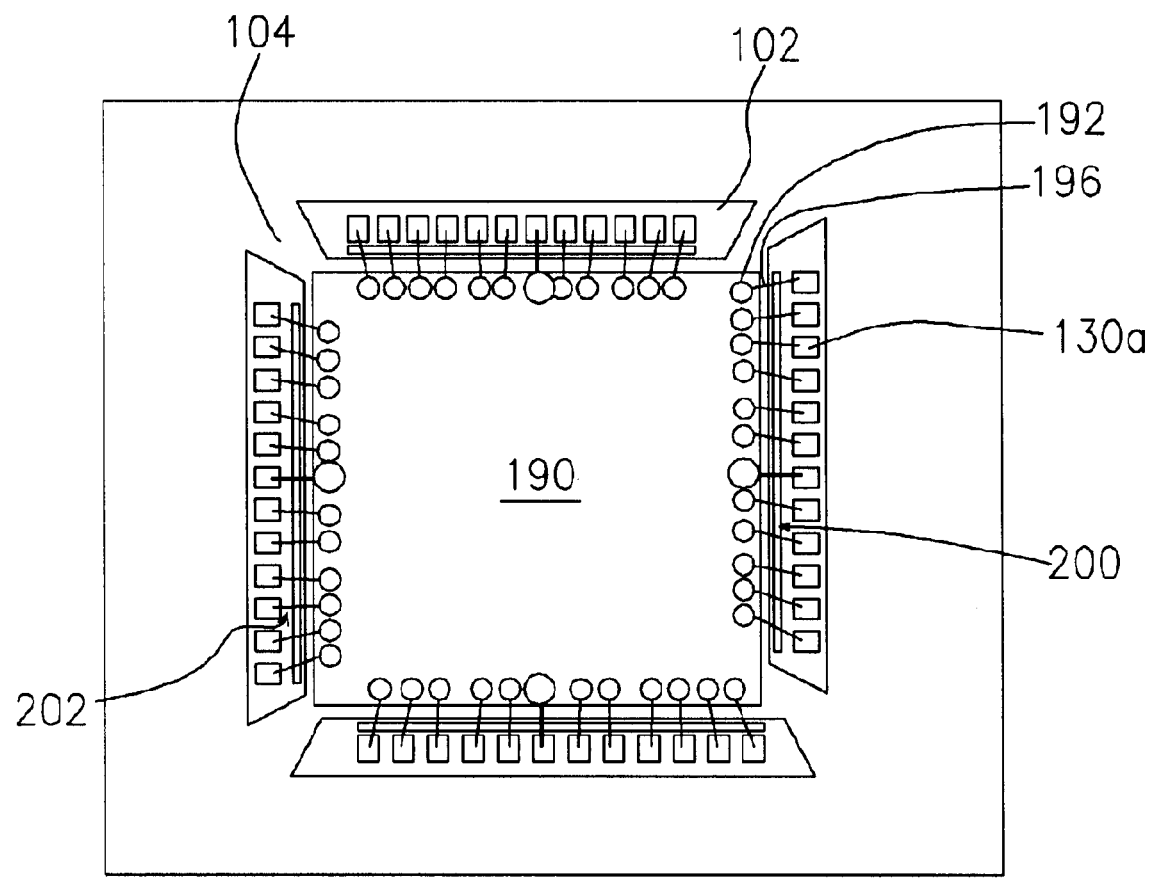
FIG. 2 is a top view of the BGA package substrate shown in FIG. 1.

FIG. 2 is a top view showing the IC chip 190 attached to the metal substrate 104 using the bonding wires 196 connecting the pads of the IC chip and the wire bonding pads 130a. A VSS ring 200 and a VDD ring 202 are arranged around the die attachment area.

The interconnect substrate 122 including wire bonding pads 130a, wiring layers 132, 134, may be pre-fabricated and then attached to the metal substrate 102 as a part of the fabrication process.

In case of fabricating a PGA package, a plurality of pins is attached to the second surface of the interconnect substrate 122 to fabricate a PGA substrate.

In case of fabricating a LGA package, a plurality of hard gold pads is plated on the second surface of the interconnect substrate 122 to fabricate a LGA substrate.

According to another aspect of the present invention, the whole second surface of the metal substrate 102 is available for forming fan out layers, power/ground layers, array of solder pads. Therefore the ball grid array pads need not be routed out to the peripheral regions so that routing becomes simplified even when the semiconductor chip has a high density of wire bond pads. Further, the above structure allows a substantial reduction of the semiconductor chip package size, and therefore the package will occupy a reduced space on the PCB. Because of the size reduction, the total length of the interconnects from the die to the edges of the package substrate can be shortened and thereby reducing the signal transmission delays. In other words, the operating speed of the device can be effectively increased.

According to another aspect of the present invention, since the interconnect substrate is fabricated using thin-films with a higher wiring density, a comparatively less number of wiring layers and a less amount of materials are required. Thus the cost can be substantially reduced. Further, the process is simplified and also the duration of most process steps shortened and therefore the throughput is increased and overall fabrication cost is effectively reduced.

According to another aspect of the present invention, in spite of the increased wire bonding length due to the substrate thickness (about 0.5–0.7 mm), the substrate size reduction is projected to be several millimeters. The total bond wire length can be considered to have two sections, the first section begins from the die pad 192 extending up to the level of the first surface 102 of the metal substrate 100 and the second section begins from the level of the first surface 102 of the metal substrate extending up to the wire bonding pad 130a. The first section of the wire is actually shorter than that of a conventional cavity down BGA wire. The second wire section begins after the wire reaches inside the die cavity, where it becomes a controlled impedance wire because the sidewall of the metal substrate 100 is also the electrical ground plane. Further, because the size of the semiconductor chip package is reduced, therefore the total length of the interconnects from the die to the edges of the package substrate is shortened, and the electrical performance of this invention should be better than that of an existing cavity down package design.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A structure of a substrate for a high-density semiconductor package comprising:
a metal substrate having a first surface and a second surface, wherein the first surface comprises at least a die attachment area located at a prescribed location;
an interconnect substrate having a top surface and a bottom surface, wherein said top surface of said interconnect substrate is attached to the second surface of the metal substrate, wherein said interconnect substrate comprises means for electrically connecting with an IC chip through one or more slots on the metal substrate with wire bonds, and wherein the bottom surface of the interconnect substrate comprises connection means for electrically connecting to a printed circuit board, so that signals from the IC chip can be transmitted through the interconnect substrate to a printed circuit board; and at least a thermally conductive via attached to the second surface of the metal substrate underneath the die attachment area for connecting with the printed circuit board for conducting heat from the metal substrate to the printed circuit board.

2. The structure according to claim 1, wherein the interconnect substrate comprises a plurality of wire bonding pads in prescribed locations, and wherein a laser beam is used to remove portions of the interconnect substrate to expose the wire bonding pads.

3. The structure according to claim 2, wherein the exposed wire bonding pads is plated with Ni/Au metals.

4. The structure according to claim 3, wherein the IC chip is electrically connected with the plated wire bonding pads using a plurality of bonding wires.

5. The structure according to claim 3, wherein the Ni/Au plating step is performed after the last layer of metal is deposited and vias to the next to the last metal layer are connected.

6. The structure according to claim 3, wherein the Ni/Au plating step is performed after the exposure of the wire bonding pads are completed by laser.

7. The structure according to claim 3, wherein the Ni/Au plating step is performed before the last layer of metal is patterned so that in case there is an open line or open via in the preceding metal layers, the corresponding wire bonding pads will not have deposits of Ni/Au material on the pad surface so that deposits of Ni/Au material can be visually inspected easily and therefore the need of an open test of a O/S test can be eliminated.

8. The structure according to claim 1, wherein a plurality of thermal conductive vias and a plurality of signal/power conductive vias are disposed between the dielectric layers and on the bottom surface of the interconnect substrate for heat transfer and signal/power distribution respectively.

9. The structure according to claim 1, wherein the metal panel is singulated into individual substrates to facilitate the IC chip attachment and other assembly steps.

10. The structure according to claim 1, wherein the metal panel is comprised of a single strip or a plurality of strips having a plurality of die attachment areas, wherein each said die attachment area is to facilitate IC chip attachment and other assembly steps.

11. The structure according to claim 1, wherein a material for making the metal substrate can be one selected from a group consisting of copper, stainless steel or aluminum.

12. The structure according to claim 1, wherein more than one die attachment areas can be formed on the metal substrate, and wherein for each die attachment area, one or more wire bonding slots are fabricated on the metal substrate for wire bonding.

13. The structure according to claim 1, wherein the dielectric material is screened on the metal substrate or laminated on the metal panel as part of a build up process.

14. The structure according to claim 1, wherein the dielectric material is comprises of a glass fiber material to strengthen the areas underneath the wire bond pads.

15. The structure according to claim 1, wherein a metal foil is laminated on the metal substrate as part of a interconnect forming process.

16. The structure according to claim 1, wherein a metal layer is formed directly on top of the dielectric film by performing a wet etching step.

17. The structure according to claim 1, wherein one or more metal layers are formed using the thin film semi-additive plating process.

18. The structure according to claim 1, wherein a subassembly of metal/dielectric layers is pre-fabricated in the interconnect substrate and then the interconnect substrate is attached to the metal panel as part of the fabrication process.

19. The structure according to claim 1, wherein a set of pedestals are etched or plated on the metal substrate surface at prescribed regions of the BGA pads before the dielectric layer is deposited, so that the dielectric layer thickness in the prescribed regions is reduced to substantially facilitate thermal vias to conduct heat to the BGA pads.

20. The structure according to claim 1, wherein a plurality of pins are attached to the second surface of the interconnect substrate to make a pin grid array (PGA) substrate.

21. The structure according to claim 1, wherein a plurality of hard gold pads are plated on the second surface of the interconnect substrate to make a land grid array (LGA) substrate.

* * * * *